United States Patent

[11] 3,607,679

[72] Inventors David O. Melroy
Springfield, N.J.;
William H. Orr, Allentown, Pa.; Frank P. Pelletier, Hanover; Willis H. Yocom, Chatham, N.J.

[21] Appl. No. 821,844
[22] Filed May 5, 1969
[45] Patented Sept. 21, 1971

[73] Assignee Bell Telephone Laboratories, Incorporated
Murray Hill, Berkeley Heights, N.J.

[54] METHOD FOR THE FABRICATION OF DISCRETE RC STRUCTURE
4 Claims, 17 Drawing Figs.

[52] U.S. Cl. .......... 204/15, 29/195, 29/620, 29/625, 117/212, 156/8, 204/38 A, 204/192, 317/258
[51] Int. Cl. .......... C23b 5/48, C23f 17/00, C23c 15/00
[50] Field of Search .......... 204/15, 38; 156/8; 117/212; 29/620, 625; 317/258

[56] References Cited

UNITED STATES PATENTS

| | | | |
|---|---|---|---|
| 3,217,209 | 3/1966 | Kinsella et al. | 204/38 |
| 3,256,588 | 6/1966 | Sikiwa et al | 204/15 |
| 3,387,952 | 6/1968 | La Chapelle | 204/15 |
| 3,423,821 | 1/1969 | Nishimura | 29/626 |
| 3,443,311 | 5/1969 | Worobey | 29/620 |
| 3,487,522 | 1/1970 | Harinxma | 29/195 |
| 3,489,656 | 1/1970 | Balde | 117/212 |

*Primary Examiner*—Howard S. Williams
*Assistant Examiner*—T. Tufariello
*Attorneys*—R. J. Guenther and Edwin B. Cave

ABSTRACT: A technique for the fabrication of tantalum-based resistors and capacitors on a single substrate involves a series of process steps wherein an anodic tantalum oxide film initially formed on areas destined for use as either resistors or capacitors serves as an etch stop when removing subsequently deposited tantalum components therefrom.

Figure 1A:
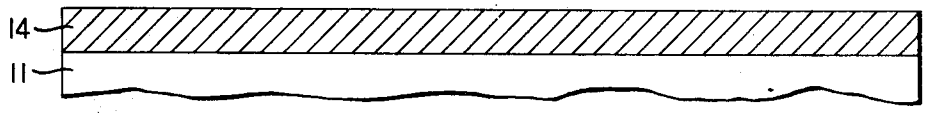

INVENTORS D. O. MELROY
W. H. ORR
F. P. PELLETIER
W. H. YOCOM

BY Edward M. Fink

ATTORNEY

METHOD FOR THE FABRICATION OF DISCRETE RC STRUCTURE

This invention relates to a technique for the fabrication of a discrete thin film RC circuit. More particularly, the present invention relates to a technique for the fabrication of a thin film structure comprising tantalum based resistors and capacitors upon a single substrate.

In recent years, miniaturization of components and circuitry coupled with the increasing complexity of modern electronic systems have created an unprecedented demand for reliability in thin film components and the need for the total exploitation of the technology. This is particularly true in the case of tantalum which has long been recognized as being the most versatile of the thin film materials. In order to maximize the advantages of such versatility, it is often desirable in the fabrication of RC structures on a single substrate to employ different tantalum films, one as a resistor material and one as a capacitor material. Oft times, these films differ in thickness and type, as for example, beta tantalum, low density tantalum, tantalum nitride, and so forth, so complicating the processing sequence due to the fact that the selective etching procedures commonly employed fail to provide etchants capable of distinguishing the various films. Heretofore, the most common technique for overcoming this drawback has involved the use of mechanical masking. Unfortunately, mechanical masking suffers from the inherent defect of imposing limitations on pattern definition and is found to be economically prohibitive. Although other procedures for effecting this end are known, they too suffer from certain inherent deficiencies.

In accordance with the present invention, the prior art problems are effectively obviated by a novel processing sequence wherein an anodic tantalum oxide film initially formed on either resistors or capacitors serves as an etch stop when removing subsequently deposited tantalum components from the initially deposited areas.

The invention will be more readily understood from the following detailed description taken in conjunction with the accompanying drawing wherein:

FIGS. 1A through 1J are cross-sectional views in successive stages of manufacture of a tantalum RC circuit wherein the capacitor film is initially deposited, and FIGS. 2A through 2G are cross-sectional view in successive stages of manufacture of a tantalum RC circuit wherein the resistor film is initially deposited.

The present invention may conveniently be described in detail by reference to illustrative examples wherein the processing sequence involves either the deposition of the capacitor component of the RC circuit initially or after deposition of the resistor component. The former will now be discussed.

The first step in the practice of the present invention involves selecting a suitable substrate member. In order to obtain the best quality of metal deposit, it is preferred that the substrate be possessed of a smooth surface which is completely free from sharp changes in contour. Materials suitable for this purpose include glasses, glazed ceramics, high melting glazed metals, and the like. These materials also meet the requirements of heat resistance and nonconductivity essential for substrates utilized in reactive sputtering techniques.

The substrate chosen is first vigorously cleaned in order to rid the surface thereof of contaminants. Conventional cleansing techniques may suitably be employed to effect this end, the choice of a particular procedure being dependent upon the composition of the substrate itself. For example, where the substrate consists of glass or a glazed ceramic, ultrasonic cleansing followed by boiling in hydrogen peroxide is a convenient method for cleaning the surface.

Following the cleaning procedure, it may be desirable to deposit a thin layer of a film-forming metal upon the substrate by conventional cathodic sputtering or vacuum evaporation techniques and thermally oxidize the resultant deposited film in accordance with the technique described in U.S. Pat. No. 3,220,938, issued on Nov. 30, 1965. The resultant oxide film serves the purpose of protecting the substrate from attack by corrosive etchants during the course of the subsequent processing. However, it will be understood by those skilled in the art that if the substrate selected is capable of withstanding contact with reagents used in the subsequent processing there is no need for its presence.

The next step in the practice of the present invention involves deposition of the capacitor film. The capacitor film desired at this juncture comprises beta tantalum and deposition thereof is effected by cathodic sputtering techniques at voltages ranging from 4000 to 6000 volts and current densities ranging from 0.5 to 5 milliamperes per square inch in an argon ambient comprising from 20 to 30 microns of argon. The thickness of the beta tantalum layer may suitably range from 3000 to 10,000 Angstroms, such limits being dictated by practical considerations, for example, the anodization voltage and the base resistance of the capacitor electrode. For the purposes of this invention, the minimum thickness of the beta tantalum layer is dependent upon two factors. The first of these is the thickness of metal which is to be converted into the oxide form during the subsequent anodizing step. The second factor is the minimum thickness of unoxidized metal remaining after anodization commensurate with the maximum resistance which can be tolerated in the beta tantalum electrode. It has been determined that the preferred minimum thickness of the beta tantalum is approximately 3000 angstroms as noted above. There is no maximum limit on this thickness although little advantage is gained by the increase above 10,000 angstroms. It may be helpful during the course of the sputtering reaction to heat the substrate to a temperature within the range of 200° to 400° C. for the purpose of promoting adequate adherence of the beta tantalum to the oxide underlay and substrate. FIG. 1A is a cross-sectional view of a substrate 11 having a layer of beta tantalum 14 deposited thereon.

Figure 1B:
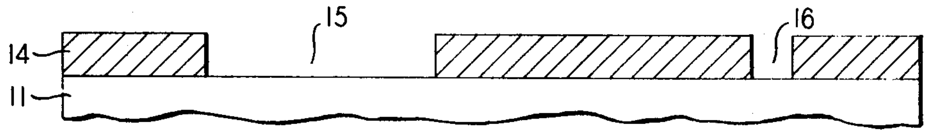

The next step in the inventive process involves photoengraving a pattern in layer 14 so as to completely remove certain portions thereof to yield a resistor window and capacitor slit. Any one of the well-known conventional procedures may be used to effect this end, the etchant being selected typically including hydrofluoric acid. FIG. 1B is a cross-sectional view of the resultant assembly showing resistor window 15 and capacitor slit 16. Numerals 15 and 16 represent the areas from which beta tantalum was removed by the photoengraving technique.

Figure 1C:
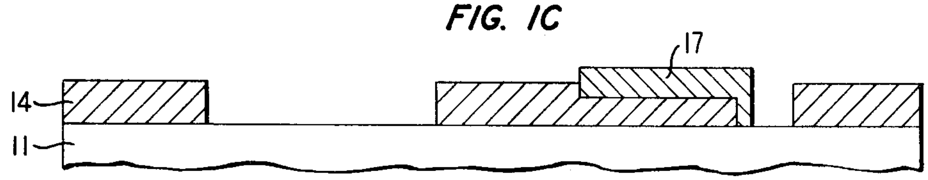

Following, the resultant assembly is anodized for the purpose of forming an anodic oxide film which will serve as an etch stop to protect the beta tantalum of the capacitor base electrode during subsequent processing steps. Prior to anodization, it is necessary to mask those areas not required to be anodized. This is conveniently accomplished by means of a suitable photoresist, masking grease, and so forth. The anodization step itself may be any conventional procedure commonly employed for this purpose such as electrolytic anodization, and so forth. Examples of preferred electrolytes are aqueous solutions of oxalic acid, citric acid, tartaric acid, and so forth. FIG. 1C is a cross-sectional view of the structure of FIG. 1B after anodization of a portion of beta tantalum layer 14 to yield tantalum pentoxide layer 17. After the anodization, the mask is removed and the assembly cleaned by conventional cleaning techniques in order to remove contaminants and mask residues.

Thereafter, a layer of tantalum nitride 18 (FIG. 1D) is deposited upon the entirety of the structure shown in FIG. 1C. This end is attained by reactively sputtering tantalum in a nitrogen-containing ambient at voltages ranging from three to seven kilovolts at partial pressures of nitrogen ranging from $10^{16}$ to $10^{13}$ torr. For the purposes of this invention, the minimum thickness of the layer so deposited is approximately 500 angstroms. There is no maximum limit on this thickness although little advantage is gained by an increase beyond 2000 angstroms.

Figure 1D:
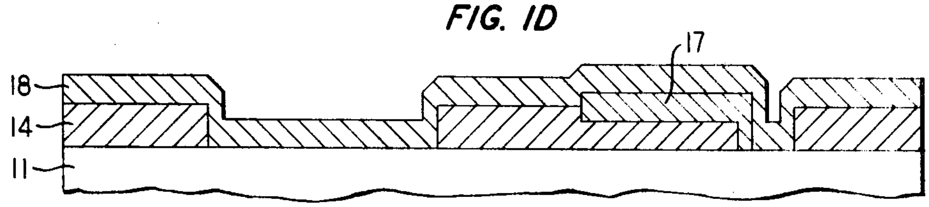
Figure 1E:
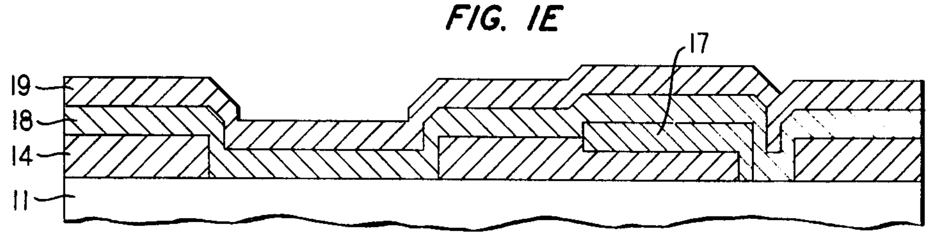
Figure 1F:
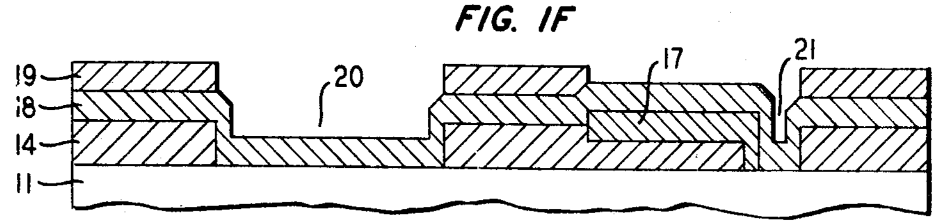

Next, a conductor contact film is deposited over the entirety of the structure shown in FIG. 1D. The contact film 19, shown in FIG. 1E, provides a base conductor in the circuit for interconnections and may be a titanium-gold or a NICHROME-gold film. Once again the thickness of this film is not critical, the minima and maxima being dictated by practical considerations. An exemplary procedure involves deposition of a thin film of either NICHROME or titanium of a thickness within the range of 100–500 angstroms followed by the deposition of a gold film ranging in thickness from 1000 to 10,000 angstroms. Then, conductor contact film 19 is etched off the resistor using the window pattern depicted in FIG. 1B and off the capacitor pattern using a window pattern which combines the anodization area shown in FIG. 1C and the slit area of FIG. 1B. The resultant structure is shown in FIG. 1F numerals 20 and 21 representing the areas from which the conductor contact film 19 was removed. This etching step is effected by a repetitive etching technique which involves masking the contact film in those areas in which its retention is desired and immersing the assembly in a potassium iodide-iodine solution and then a potassium iodide-water solution for the purpose of removing the gold. Following, the titanium portion of the contact film is removed with a suitable etchant typically comprising dilute hydrofluoric acid, nitric acid and water. NICHROME may suitably be removed with hydrochloric acid.

Figure 1G:
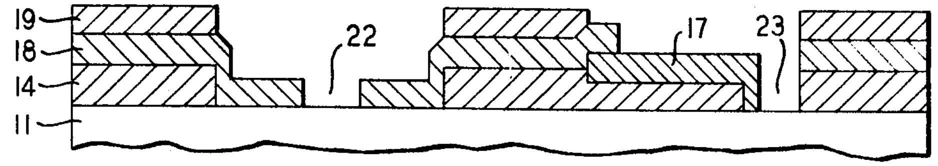
Figure 1H:
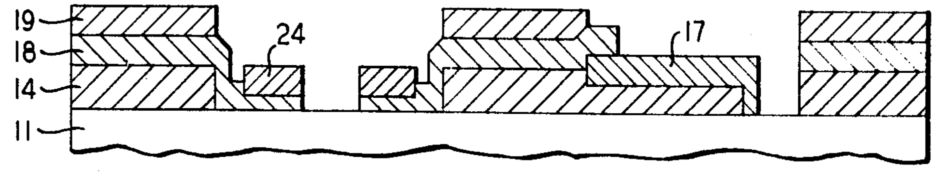

Thereafter, the structure is again suitably masked and etched to form the desired resistor pattern, removing tantalum nitride from those areas destined to be nonconducting in nature. This end may conveniently be effected with a 5:1:1 hydrofluoric acid, nitric acid, water solution. The resultant structure is shown in FIG. 1G, numerals 22 and 23 representing the areas from which tantalum nitride film 18 was removed.

At his point, the resistor track is anodized, the other portion of the circuit being masked with a suitable grease or photoresist. Anodization may be effected in the manner set forth above to yield an anodized layer of tantalum nitride 24 shown in FIG. 1H. This anodization may be conducted so that the value of the resistor at the be conclusion of the anodization process is less than that ultimately desired, trim anodization being subsequently employed to yield the desired value.

Following, all masking is removed and the resistors so produced heated in the presence of air at temperatures within the range of 250° to 400° C. for a time period ranging from 1 to 5 hours, thereby stabilizing the nitride films. The capacitor portion of the circuit is then reanodized, a suitable mask having been applied to the remainder of the circuit.

Figure 1I:
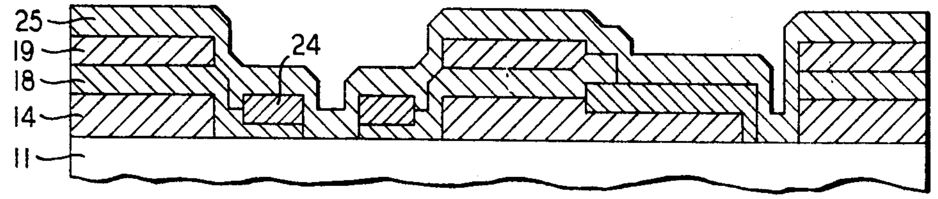

Next, a NICHROME-gold layer 25, shown in FIG. 1I, is evaporated over the entire substrate for the purpose of providing a capacitor counterelectrode and conductor film. The thickness of this layer is not critical, the minima and maxima being dictated by practical considerations. An exemplary procedure for effecting this end involves deposition of a NICHROME film typically ranging in thickness from 400 to 700 angstroms followed by the deposition of a gold film ranging in thickness from 5000 to 10,000 angstroms. It will be understood by those skilled in the art that other contact materials may be substituted for the NICHROME-gold described above, such as gold, palladium, niobium, etc.

Figure 1J:
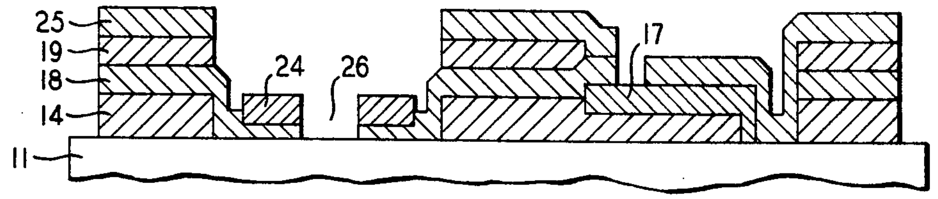

The next step in the inventive process involves etching the NICHROME-gold film off the resistor and the final step involves removing conducting layers of film from nonconducting areas of the circuit while defining the counterelectrodes of the capacitors. Once again, suitable masking procedures are used to protect the areas of NICHROME-gold it is desired to retain, etching of the gold being effected in a sequential operation utilizing potassium iodide-iodine solutions followed by rinses in potassium iodide-water solutions in the manner described above. Hot hydrochloric acid is then used to remove the NICHROME layer. Tantalum and tantalum nitride are also etched at this point in those regions not previously etched. The resultant structure is shown in FIG. 1J, numeral 26 representing the area from which NICHROME-gold was removed from the resistor. If required, the structure may then be subjected to trim anodization employing conventional anodization techniques as delineated above.

Turning now to a second illustrative example, it may be desirable to fabricate an RC circuit in accordance with the present invention wherein the resistor component of the circuit is initially deposited. This procedure will now be discussed.

A suitable substrate member bearing an oxide underlay of the type described above is selected. It will be understood by those skilled in the art that the process practices employed above are identical to those employed in the embodiment under discussion: however, the processing sequence is varied.

Figure 2A:
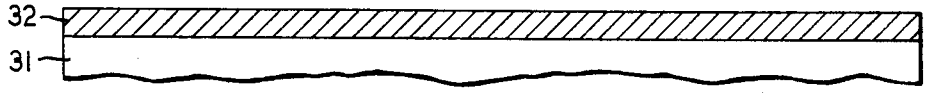
Figure 2B:
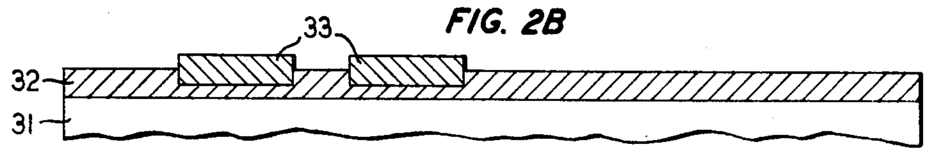

Thus, the first step now involves deposition of a tantalum nitride layer upon the entirety of the substrate member. FIG. 2A is a cross-sectional view of a substrate member 31 bearing a sputtered film of tantalum nitride 32. Following deposition of the tantalum nitride layer, the assembly is subjected to anodization in those areas destined for use as a resistor. This end is effected by coating the substrate with a suitable mask such as a photoresist and anodizing as described above. The resultant structure including anodized layers 33 is shown in FIG. 2B. Layers 33 serve as the etch stop when the capacitor beta tantalum film is removed from the resistor track as discussed below.

Figure 2C:
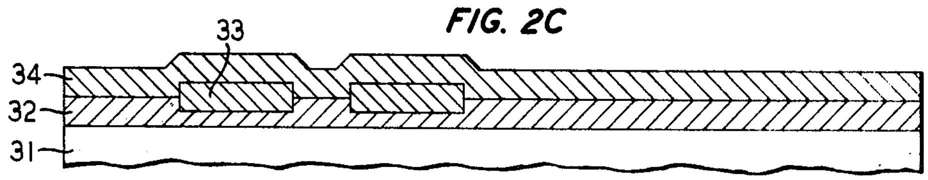

Following anodization, the structure shown in FIG. 2B is heat treated for the purpose of thermally stabilizing the resistors, as discussed previously. Then, the beta tantalum capacitor film 34 shown in FIG. 2C is deposited upon the entire assembly and a capacitor slit etched therein to define the edges of the capacitor base electrode. Numeral 35 represents the area of the capacitor slit from which beta tantalum and tantalum nitride has been removed (FIG. 2D).

Figure 2D:
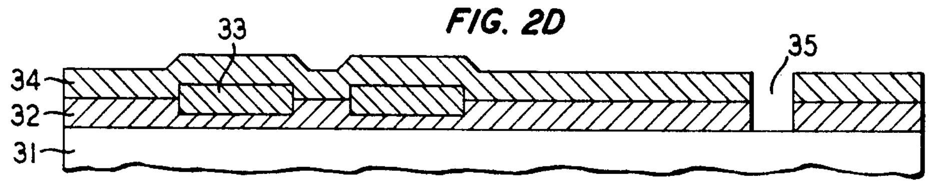
Figure 2E:
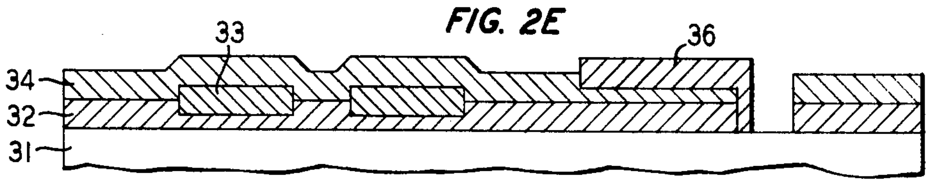

Next, the area of the structure of FIG. 2D destined for use as a capacitor is anodized after providing a suitable mask for those areas which it is desired to retain in an unanodized condition. Again, the anodization step employed may be selected from among any prior art method utilizing an electrolyte such as citric, oxalic or tartaric acids. FIG. 2E is a cross-sectional view of the structure of FIG. 2D after anodization of a portion of the beta tantalum layer 34 to yield tantalum pentoxide layer 36. Subsequent to anodization, the mask is removed and the assembly cleaned for the purpose of removing mask residues.

Figure 2F:
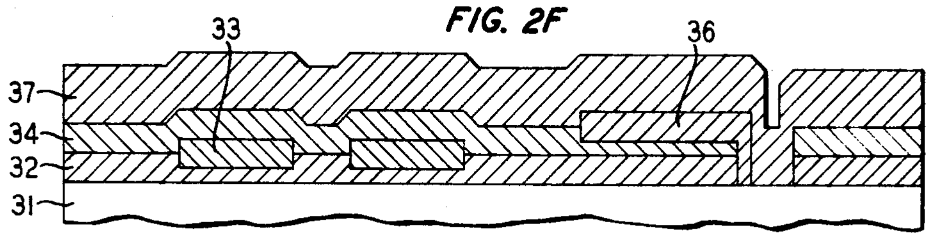
Figure 2G:
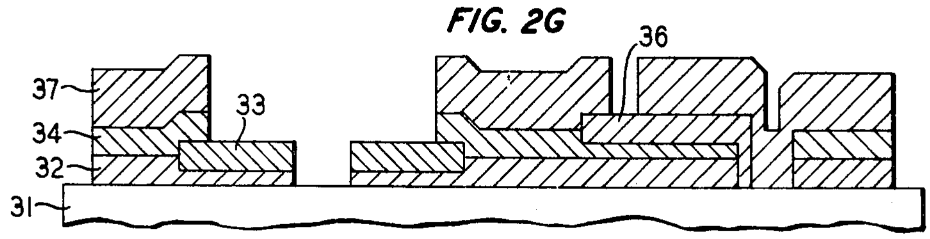

Then, a conductor contact film 37, shown in FIG. 2F comprising either NICHROME-gold, chromium-gold or titanium-gold is deposited over the entirety of the structure by conventional evaporation techniques, choice of a particular film being dependent upon the criticality of the capacitor properties.

As indicated previously, NICHROME is generally preferred since it typically provides better capacitor properties.

All that remains to be done at this point is to etch the conductor and capacitor counterelectrode pattern. This may be conveniently accomplished in the manner described above with respect to either the NICHROME-gold or titanium-gold films, or beta tantalum and tantalum nitride. Finally, the etched structure is masked and the resistors trim anodized to yield the structure shown in FIG. 2G.

It will be understood by those skilled in the art that the foregoing illustrative examples describe two competing integral processes which combine a plurality of expedients for the purpose of effecting a novel end.

An example of the present invention is described in detail below. The example and the foregoing illustrations are included merely to aid in the understanding of the invention and variations may be made by one skilled in the art without departing from the spirit and scope of the present invention.

EXAMPLE

A glass microscope slide approximately 1½ inches in width and 3 inches in length having deposited thereon a layer of tantalum pentoxide ~1500 angstroms in thickness was selected as the substrate. The substrate was cleaned ultrasonically with "Alconox" and rinsed in overflowing tap water. Thereafter it was placed in boiling hydrogen peroxide and then rinsed in distilled water followed by a further rinse in overflowing distilled deionized water. The substrate was then blown dry in nitrogen and fired in an oven at 550° C. for 30 minutes.

The substrate was then placed in a sputtering chamber and the chamber evacuated by means of a roughing pump and an oil diffusion pump to a pressure of approximately $1\times10^{16}$ torr. Next, the substrate was heated to a temperature of approximately 400° C. at which point argon was admitted into the chamber at a pressure of approximately 20 microns of Hg. A direct current voltage of 4000 volts was then impressed between the cathode and anode at a current density of approximately 3 milliamperes per square inch, the cathode being comprised of a circular tantalum disc 40 mils thick and 14 inches in diameter of high purity. Sputtering was conducted for approximately 45 minutes, so resulting in the formation of a 5000 angstroms thick layer of beta tantalum.

Following, a photosensitive etch resist was applied to the beta tantalum and processing effected in accordance with conventional photoengraving techniques for the purpose of etching a resistor window and capacitor slit, the etchant being a 5:1:1 solution of hydrofluoric acid, nitric acid and water. Then, anodization of the assembly was effected in a 0.01 percent citric acid-water solution with a current density of approximately one milliampere per square centimeter to approximately 90 percent of the final desired anodization voltage, those areas not destined for anodization having been suitably masked. After anodization, the structure was cleaned without firing as described above.

Next, the assembly was again placed in a sputtering apparatus and the chamber evacuated to a pressure of $5\times10^{17}$ torr. After attaining such pressure, nitrogen was admitted into the chamber at a partial pressure of approximately $6\times10^{14}$ torr. and after obtaining equilibrium argon was admitted at a pressure of approximately 12 microns of Hg. Sputtering was effected by impressing 6600 volts DC between cathode and anode at a current of approximately 250 milliamperes. Sputtering was conducted for a time period sufficient to yield a tantalum nitride film 1000 angstroms in thickness.

After deposition of the tantalum nitride layer, the assembly was placed in a vacuum evaporation apparatus and 500 angstroms of titanium deposited thereon followed by 5000 angstroms of gold. Next, the resultant titanium-gold film was etched off the resistor track and capacitor pattern by masking those areas which it was desired to retain by means of a suitable grease and immersing the structure in a potassium iodide-iodine solution for 30 minutes followed by a rinse in potassium iodide-water solution and the cycle repeated until the gold was removed as observed visually. The titanium was removed by etching in a 1:1:20 solution of hydrofluoric acid, nitric acid and water.

At this point, the structure was again masked and etched in a 5:1:1 hydrofluoric acid-nitric acid-water solution for the purpose of defining the resistor pattern.

Next, the resistor track was anodized in a 0.01 percent citric acid-water solution to a value lower than that ultimately desired and the resistor stabilized by heating in air for one hour at 400° C. The next step involved reanodizing the capacitor in a 0.01 percent citric acid solution at full voltage for one hour at current density of one milliampere per square centimeter. Then a NICHROME layer 500 angstroms thick was evaporated as a capacitor counterelectrode and as a contact between it and the rest of the circuit and 5000 angstroms of gold evaporated thereon by conventional vacuum evaporation techniques. Next, the NICHROME-gold was etched off the resistor in a potassium iodide-iodine solution followed by hot hydrochloric acid (for the NICHROME) and the conductor and counterelectrode pattern generated by sequentially etching the gold-NICHROME, gold-titanium, tantalum nitride and tantalum layers. The resistor areas were masked during the etching sequence for protective purposes. Finally, the resistors were trim anodized in citric acid to the desired value.

The term "Nichrome" as employed herein defines a range of nickel-chromium alloys containing from 40–80 percent, by weight, nickel, remainder chromium.

What is claimed is:

1. A process for the fabrication of a thin film discrete RC network which comprises the steps of (a) depositing a layer of tantalum nitride on a substrate member, (b) anodizing a portion of said tantalum nitride layer in those areas destined for use as resistors, so resulting in the formation of an anodic oxide layer thereon, (c) stabilizing said resistors by heating in air at temperatures ranging from 250° to 400° C., (d) depositing a layer of beta tantalum over the entirety of the resultant structure including the said anodic oxide layer, (e) anodizing a portion of said layer of beta tantalum in those areas destined for use as a capacitor, (f) depositing a contact electrode over the entirety of said beta tantalum layer including the anodized portion thereof, and (g) generating a conductor and capacitor pattern in said assembly.

2. A process in accordance with claim 1 wherein said tantalum nitride and beta tantalum layers are deposited by cathodic sputtering techniques.

3. A process in accordance with claim 1 wherein said contact electrode comprises NICHROME-gold.

4. A process for the fabrication of a thin film discrete RC network which comprises the steps of (a) depositing a layer of beta tantalum upon a substrate member, (b) generating a resistor window and a capacitor slit in said beta tantalum layer, (c) anodizing said beta tantalum layer in those areas destined for use as a capacitor, (d) depositing a layer of tantalum nitride over the entirety of the resultant assembly, (e) depositing a layer of a contact electrode upon said tantalum nitride layer and removing said contact electrode in those areas destined for use as resistors and capacitors, the underlying tantalum nitride being removed from capacitor areas, (f) anodizing and stabilizing resultant exposed resistor areas, (g) reanodizing said capacitor area, (h) depositing a contact electrode over the entirety of said assembly, and (i) removing said contact electrode from the resistor and removing all film layers from nonconducting areas of the resultant structure, thereby defining the capacitor counterelectrode.